(12) United States Patent
Matsuyama et al.

(10) Patent No.: US 6,400,209 B1
(45) Date of Patent: Jun. 4, 2002

(54) SWITCH CIRCUIT WITH BACK GATE VOLTAGE CONTROL AND SERIES REGULATOR

(75) Inventors: Toshiyuki Matsuyama; Koichi Inatomi, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/526,748

(22) Filed: Mar. 16, 2000

(30) Foreign Application Priority Data

Aug. 5, 1999 (JP) .......................................... 11-222747

(51) Int. Cl.[7] ........................ H03K 17/687; G05F 1/46; G05F 3/16
(52) U.S. Cl. ...................... 327/534; 327/427; 327/434; 327/543
(58) Field of Search ......................... 323/282; 327/534, 327/365, 427, 538, 543, 434, 537

(56) References Cited

U.S. PATENT DOCUMENTS

| 5,191,278 A | * | 3/1993 | Carpenter | 323/277 |
| 5,880,620 A | * | 3/1999 | Gitlin et al. | 327/524 |
| 5,963,080 A | * | 10/1999 | Miske et al. | 327/534 |
| 6,020,778 A | * | 2/2000 | Shigehara et al. | 327/534 |
| 6,218,819 B1 | * | 4/2001 | Tiwari | 323/285 |
| 6,225,857 B1 | * | 5/2001 | Brokaw | 327/540 |
| 6,239,649 B1 | * | 5/2001 | Bertin et al. | 327/534 |

FOREIGN PATENT DOCUMENTS

| JP | 8-330902 | 12/1996 | ............ H03K/11/24 |
| JP | 9-167950 | 6/1997 | ......... H03K/17/687 |

* cited by examiner

Primary Examiner—Terry D. Cunningham
Assistant Examiner—Terry L. Englund
(74) Attorney, Agent, or Firm—Arent Fox Kintner Plotkin & Kahn PLLC

(57) ABSTRACT

A switch circuit has an input terminal and an output terminal and when turned on, provides a voltage at its input terminal to its output terminal. A transistor is connected between the input and output terminals. A gate drive circuit is connected to the gate of the transistor and provides a gate drive signal to the gate. The gate drive circuit, in response to a first control signal, causes the gate drive signal to have one of a first voltage derived from an input voltage at the input terminal and a low potential voltage. A back gate drive circuit is connected to a back gate of the transistor and provides a back gate drive signal to the back gate. The back gate drive signal controls a voltage applied to the back gate of the transistor depending on whether the transistor is turned on or off. The switch circuit may be used to selectively supply battery power to a portable electronic device.

11 Claims, 4 Drawing Sheets

SWITCH CIRCUIT WITH BACK GATE VOLTAGE CONTROL AND SERIES REGULATOR

BACKGROUND OF THE INVENTION

The present invention relates to a switch circuit and a series regulator, and more particularly, to a switch circuit and a series regulator that selectively supplies power to circuits of portable electronic devices.

Recent portable electronic devices are provided with switch circuits to stop supplying power to circuits that do not need to be operated.

FIG. 1 is a block diagram showing a first example of a prior art electronic device 100, which includes a battery 12, a plurality of driven circuits 13 (only one shown) driven by the battery 12, and a plurality of switch circuits 11 (only one shown). Each switch circuit 11 is arranged in association with one of the driven circuits 13. The switch circuit 11 selectively supplies the associated driven circuit 13 with power in response to a control signal EN provided by a control circuit (not shown).

The switch circuit 11 includes an NMOS transistor 14, which functions as a main switch, a charge pump circuit 15, and a driver circuit 16. The transistor 14 has a drain connected to an input terminal IN of the switch circuit 11, a source connected to the output terminal OUT of the switch circuit 11, a gate connected to the driver circuit 16, and a back gate connected to the source.

The input terminal IN is supplied with a battery voltage VB. A control signal EN is provided to the charge pump circuit 15 and the driver circuit 16. When the control signal EN goes high, the charge pump circuit 15 pulls up the battery voltage VB to a predetermined voltage and supplies the driver circuit 16 with a drive voltage VD. The drive voltage VD is greater than the sum of the battery voltage VB and the voltage between the drain and gate of the transistor 14.

Further, the high control signal EN causes the driver circuit 16 to supply the gate of the transistor 14 with the drive voltage VD. This activates the transistor 14 and supplies the driven circuit 13 with the battery voltage VB.

When the control signal EN goes low, the charge pump circuit 15 is deactivated. Further, the driver circuit 16 connects the gate of the transistor 14 to the ground GND. This deactivates the transistor 14 and inhibits the supply of power to the driven circuit 13.

By selectively inhibiting the supply of power to the driven circuit 13 in this manner, the switch circuit 11 reduces the power supplied to the driven circuit 13 and thus, conserves battery power.

The transistor 14 has a parasitic diode 17 connected between the back gate and the drain. When the transistor 14 is deactivated, a back current flows through the parasitic diode 17 from the output terminal OUT toward the input terminal IN if the voltage VIN at the input terminal is less than a value obtained by subtracting the forward voltage VF of the parasitic diode 17 from the voltage VOUT at the output terminal OUT (VIN<VOUT−VF).

Such a back current is prevented in a second example of a prior art switch circuit 21, which is illustrated in the block circuit diagram of FIG. 2. The back gate of the transistor 14 is connected to the ground GND in the switch circuit 21. The transistor 14 has a parasitic diode 22 connected between the back gate and the source and a parasitic diode 23 connected between the back gate and the drain. The parasitic diode 22 prevents back current from flowing from the output terminal OUT toward the input terminal IN.

However, in the switch circuit 21, the voltage at the back gate is at the ground level when the transistor 14 is activated. The on resistance of the transistor 14 thus increases when the input voltage increases, as shown in FIG. 3. In other words, the on resistance of the transistor 14 is affected by the input voltage. This significantly decreases the voltage at the switch circuit 21 and hinders the supply of sufficient power to the driven circuit 13.

To solve this problem, a third example of a prior art switch, which is illustrated in FIG. 4, is provided with two transistors 14a, 14b, which are connected in series and function as a main switch. However, the series connected transistors 14a, 14b increase the scale of the switch circuit.

A transistor 14 having a smaller resistance may be used to prevent the power supply voltage from decreasing. However, such transistor would occupy a relatively large space and also increase the scale of the switch circuit.

SUMMARY OF THE INVENTION

It is an object of the present invention to provide a switch circuit and a series regulator that is relatively small and has improved operational characteristics.

To achieve the above object, the present invention provides a switch circuit including an input terminal and an output terminal. The switch circuit includes a MOS transistor connected between the input and output terminals. A gate drive circuit is connected to a gate of the transistor to provide a gate drive signal thereto. The gate drive circuit responds to a first control signal provided to the switch circuit and causes the gate drive signal to have one of a first drive voltage, which is derived from a voltage at the input terminal, and a low potential power supply level. A back gate drive circuit is connected to a back gate of the transistor to provide a back gate drive signal thereto. The back gate drive circuit controls a voltage of the back gate drive signal in accordance with whether the transistor is activated or deactivated.

A series regulator includes an input terminal and an output terminal. The series regulator has a switch circuit including a MOS transistor connected between the input and output terminals. A gate drive circuit is connected to a gate of the transistor to provide a gate drive signal thereto. The gate drive circuit responds to a first control signal provided to the switch circuit and causes the gate drive signal to have one of a first drive voltage, which is derived from a voltage at the input terminal, and a low potential power supply level. A back gate drive circuit is connected to a back gate of the transistor to provide a back gate drive signal thereto. The back gate drive circuit controls a voltage of the back gate drive signal in accordance with whether the transistor is activated or deactivated. A comparison amplifier compares the voltage at the output terminal with a predetermined reference voltage to generate the first control signal based on the comparison result.

A switch circuit, which has an input terminal and an output terminal, includes a main switch connected between the input terminal and the output terminal, a charge pump connected to the input terminal and the main switch and receiving a first control signal. The first control signal activates and deactivates the charge pump. A driver circuit is connected to the charge pump and the main switch and receives the first control signal. When the first control signal is activated, the charge pump pulls up an input voltage supplied to the input terminal to a predetermined level and provides a drive voltage to the driver circuit, which in turn generates a drive signal having substantially the same voltage as the drive voltage. The driver circuit supplies the drive signal to the main switch, thereby activating the main switch such that the input voltage is supplied at the output terminal. When the first control signal is deactivated, the drive signal is deactivated, which deactivates the main switch such that the input voltage is not provided at the output terminal. A level shift circuit receives the first control signal and generates a second control signal having substantially the same voltage level as the input voltage. A back gate drive circuit is connected between the level shift circuit and the main switch and, in response to receiving the second control signal, the back gate drive circuit generates a back gate drive signal having substantially the same voltage as the voltage at the output terminal to the main switch.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
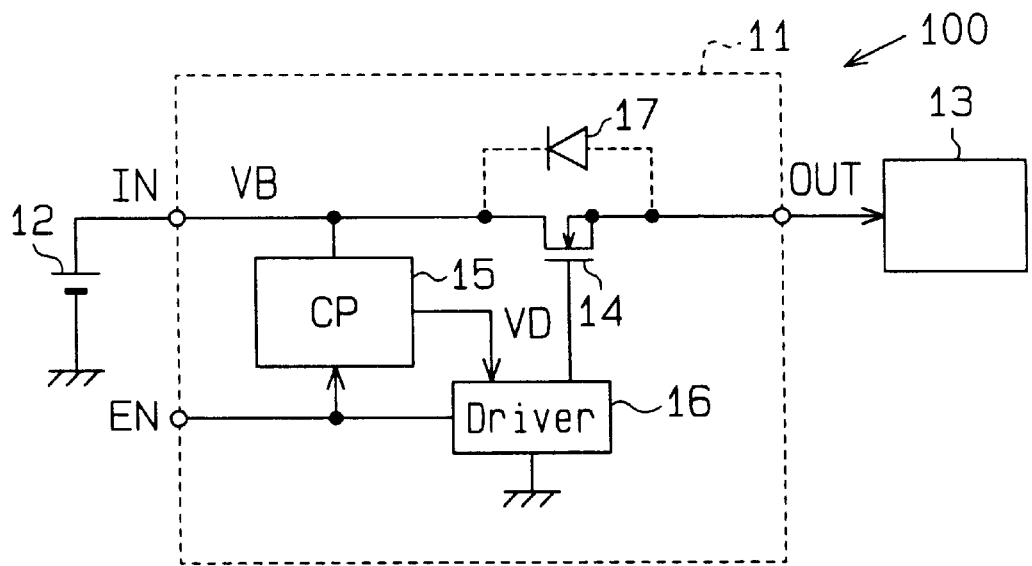
FIG. 1 is a schematic block diagram showing a first example of a prior art switch circuit.

In the drawings, like numerals are used for like elements throughout.

Figure 5:
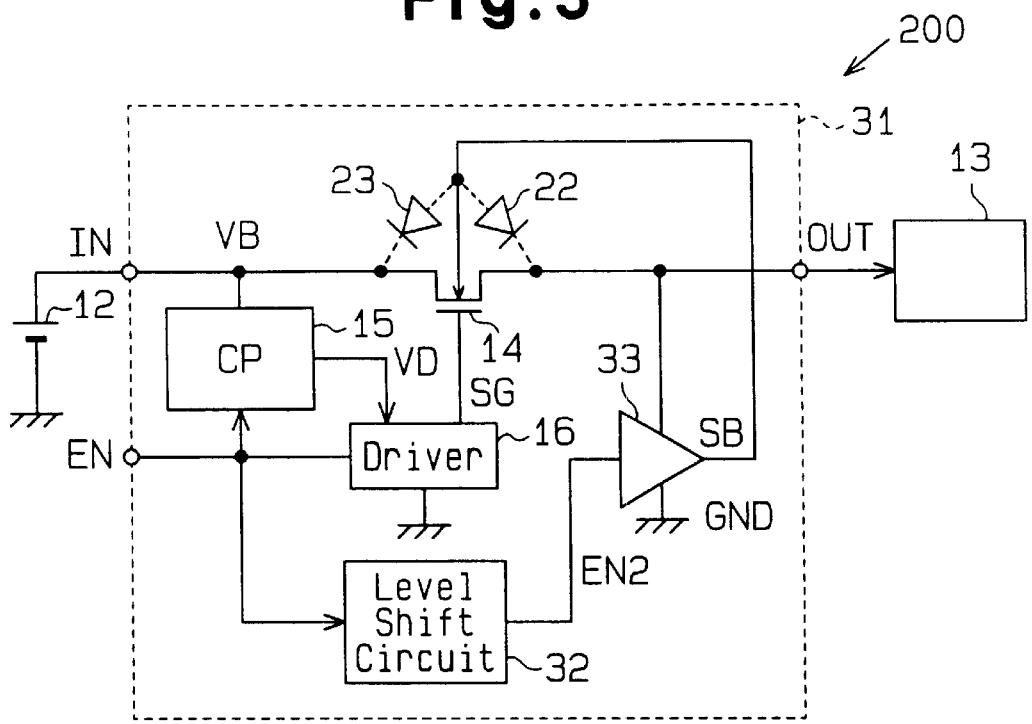
FIG. 5 is a schematic block diagram showing a switch circuit according to a first embodiment of the present invention.

With reference to FIG. 5, a portable electronic device 200 includes a plurality of switch circuits 31 (only one shown), a battery 12, and a plurality of driven circuits 13 (only one shown). Each switch circuit 31 is arranged in association with one of the driven circuits 13 and selectively supplies the associated driven circuit 13 with power.

The switch circuit 31 includes an NMOS transistor 14, which functions as a main switch, a charge pump circuit 15, a driver circuit 16, a level shift circuit 32, and a back gate drive circuit 33. The transistor 14 has a drain connected to an input terminal IN of the switch circuit 31, a source connected to the output terminal OUT of the switch circuit 31, a gate connected to the driver circuit 16, and a back gate connected to the back gate drive circuit 33. The charge pump circuit 15 and the driver circuit 16 function as a gate drive circuit.

A control signal EN is provided to the charge pump circuit 15, the driver circuit 16, and the level shift circuit 32. When the control signal EN goes high, the charge pump circuit 15 pulls up a battery voltage VB, which is supplied via the input terminal IN, to a predetermined voltage and generates a drive voltage VD, which is supplied to the driver circuit 16. The drive voltage VD is greater than the sum of the battery voltage VB and the voltage between the drain and gate of the transistor 14.

When the control signal EN goes high, the driver circuit 16 generates a gate drive signal SG, which has the same voltage as the drive voltage VD, and provides the gate drive signal SG to the gate of the transistor 14. This activates the transistor 14 and supplies the driven circuit 13 with the battery voltage VB.

When the control signal EN goes low, the charge pump circuit 15 is deactivated. Further, the driver circuit 16 provides the gate drive signal SG, which is at a low potential power supply level (e.g., ground GND level), to the gate of the transistor 14. This deactivates the transistor 14 and inhibits the supply of the battery voltage VB to the driven circuit 13. As a result, the power consumption of the portable electronic device 200 is reduced.

The level shift circuit 32 generates a control signal EN2, which voltage level is the same as the battery voltage VB, from the control signal EN and provides the control signal EN2 to the back gate drive circuit 33. The phase of the control signal EN2 is the same as that of the control signal EN. The level shift circuit 32 adjusts the voltage level of the control signal EN, provided from a control circuit (not shown), since the voltage level often differs from the battery voltage VB. The level shift circuit 32 may be deleted if the back gate drive circuit 33 functions normally at the voltage level of the control signal EN.

More specifically, when the control signal EN2 goes high (battery voltage VB level), the back gate drive circuit 33 provides the back gate drive signal SB, which voltage level is substantially the same as that of the output terminal OUT, to the back gate of the transistor 14. When the control signal EN2 goes low (ground GND level), the back gate drive circuit 33 provides the back gate drive signal SB, which voltage level is substantially the same as that of the ground GND, to the back gate of the transistor 14. At this time, the driver circuit 16 provides the gate drive signal SG to the gate of the transistor 14 in response to the control signal EN. Accordingly, the back gate drive signal SB and the gate drive signal SG provided to the transistor 14 have substantially the same phase.

Figure 6:
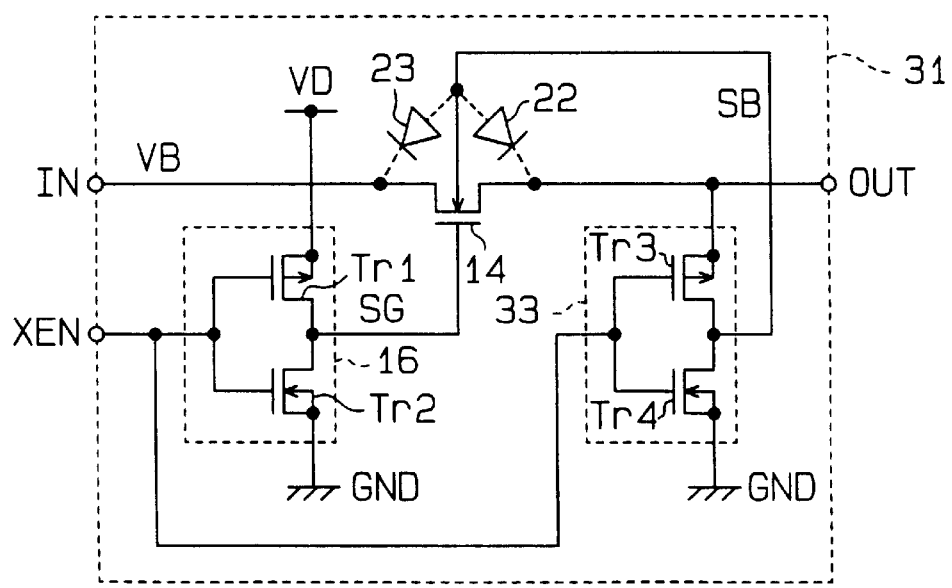
FIG. 6 is a circuit diagram showing the switch circuit of FIG. 5.

The main portions of the switch circuit 31 will now be described with reference to FIG. 6, in which the charge pump circuit 15 and the level shift circuit 32 are not shown. In accordance with the structure of the driver circuit 16 and the back gate drive circuit 33, the inverted control signal XEN of the control signal EN of FIG. 5 is shown.

The driver circuit 16 includes a PMOS transistor Tr1 and an NMOS transistor Tr2. The source of the transistor Tr1 is supplied with the drive voltage VD. The source of the transistor Tr2 is connected to the ground GND. The gates of the transistors Tr1, Tr2 are connected to each other and provided with the control signal XEN. The back gates of the transistors Tr1, Tr2 are each connected to their source. The drains of the transistors Tr1, Tr2 are connected to each other. A node between the drains of the transistors Tr1, Tr2 is connected to the gate of the transistor 14.

The back gate drive circuit 33 includes a PMOS transistor Tr3 and an NMOS transistor Tr4. The source of the transistor Tr3 is connected to the output terminal OUT. The source of the transistor Tr4 is connected to the ground GND. The gates of the transistors Tr3, Tr4 are connected to each other and provided with the control signal XEN. The back gates of the transistors Tr3, Tr4 are each connected to their source. The drains of the transistors Tr3, Tr4 are connected to each other. A node between the drains of the transistors Tr3, Tr4 is connected to the back gate of the transistor 14.

When the control signal XEN goes low (the control signal EN going high), the transistor Tr1 of the driver circuit 16 and the transistor Tr3 of the back gate drive circuit 33 are activated. This causes the gate drive signal SG provided to the gate of the transistor 14 to become substantially equal to the drive voltage VD and activates the transistor 14. Further, the back gate drive signal SB provided to the back gate of the transistor 14 becomes substantially equal to the voltage at the output terminal OUT. Since the back gate potential of the transistor 14 is substantially equal to the potential at the output terminal OUT, this state is equivalent to a state in which the back gate and source of the transistor 14 are connected to each other. Accordingly, the on resistance of the transistor 14 is not affected by the voltage at the input terminal IN, or the input terminal.

When the control signal XEN goes high (the control signal EN going low), the transistor Tr2 of the driver circuit 16 and the transistor Tr4 of the back gate drive circuit 33 are activated. This causes the gate drive signal SG provided to the gate of the transistor 14 to become substantially equal to the GND level and deactivates the transistor 14. Further, the back gate drive signal SB provided to the back gate of the transistor 14 becomes substantially equal to the ground GND level. Since the back gate potential of the transistor 14 is at the ground GND level, a parasitic diode 22 is formed between the back gate and source of the transistor 14 and a parasitic diode 23 is formed between the back gate and the drain of the transistor 14. The parasitic diode 22 prevents a back current from flowing from the output terminal OUT to the input terminal IN.

The first embodiment has the advantages described below.
(1) Due to the back gate drive circuit 33, the on resistance of the transistor 14 is not affected by the input voltage. Further, the parasitic diode 22 inhibits the flow of back current when the transistor 14 is deactivated.
(2) Due to the level shift circuit 32, the back gate drive circuit 33 is sufficiently driven by the control signal EN2 regardless of the voltage level of the control signal EN.

Figure 7:
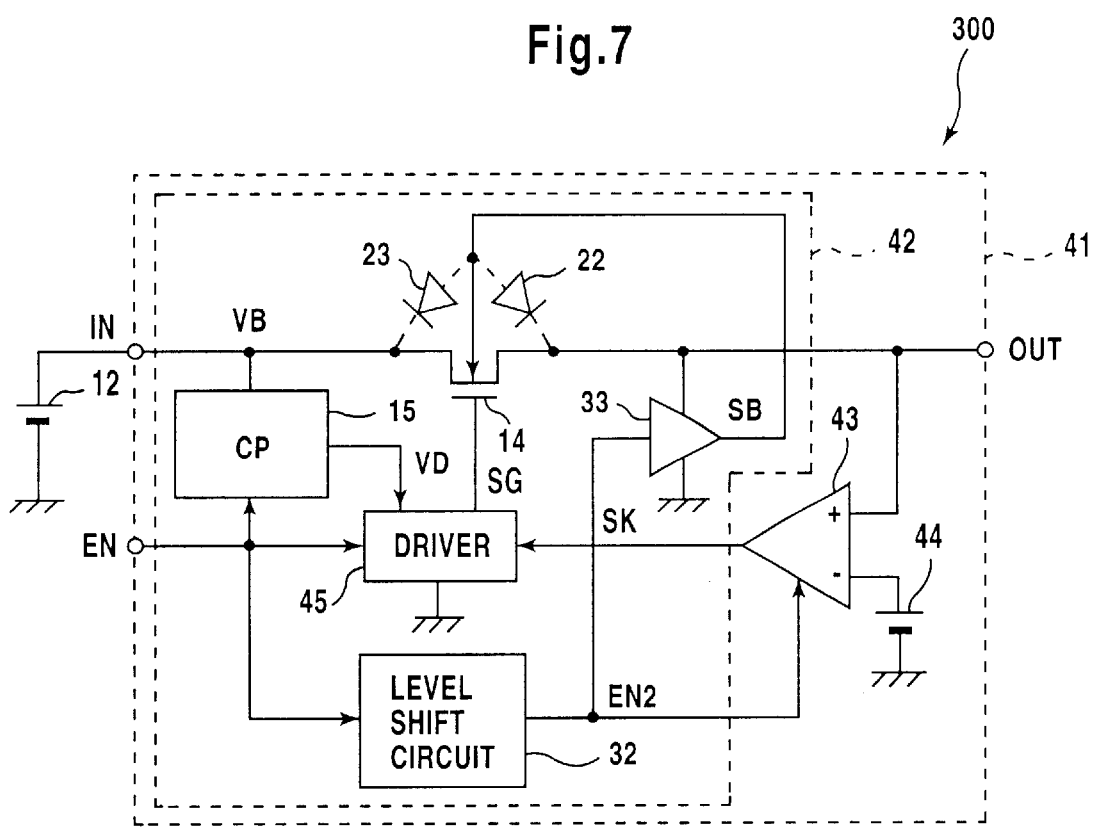
FIG. 7 is a schematic block diagram showing a series regulator according to a second embodiment of the present invention.

A series regulator 41 according to a second embodiment of the present invention will now be described with reference to FIG. 7. The series regulator 41 is preferably employed in a portable electronic device 300. The series regulator 41 has an input terminal IN connected to a battery 12 and an output terminal OUT connected to a driven circuit 13. A control circuit (not shown) provides the control signal EN to the series regulator 41. The series regulator 41 generates drive power, having a predetermined voltage, from the battery voltage VB and selectively provides the drive power to the driven circuit 13.

The series regulator 41 includes a switch circuit 42, a differential amplifier 43, which functions as a comparison amplifying circuit, and a reference power supply 44. The differential amplifier 43 has a non-inverted input terminal connected to the output terminal OUT and an inverted input terminal provided with power from the reference power supply 44. The differential amplifier 43 compares the voltage at the output terminal OUT with the reference voltage and amplifies the differential voltage (error voltage) to generate a detection signal SK, which is provided to the switch circuit 42.

The switch circuit 42 includes an NMOS transistor 14, a charge pump circuit 15, a driver circuit 45, level shift circuit 32, and a back gate drive circuit 33. In accordance with the control signal EN and the detection signal SK, the driver circuit 45 controls the voltage of the gate drive signal SG within a range between the levels of the drive voltage VD and the ground GND.

More specifically, when the control signal EN provided to the driver circuit 45 goes high, the driver circuit 45 alters the voltage level of the gate drive signal SG in accordance with the detection signal SK. This changes the on resistance of the transistor 14 in accordance with the voltage level of the gate drive signal SG and controls the conductance between the input terminal IN and the output terminal OUT. Accordingly, the battery voltage VB is altered to a predetermined voltage and a drive power corresponding to the predetermined voltage is generated from the output terminal OUT of the series regulator 41.

Figure 2:
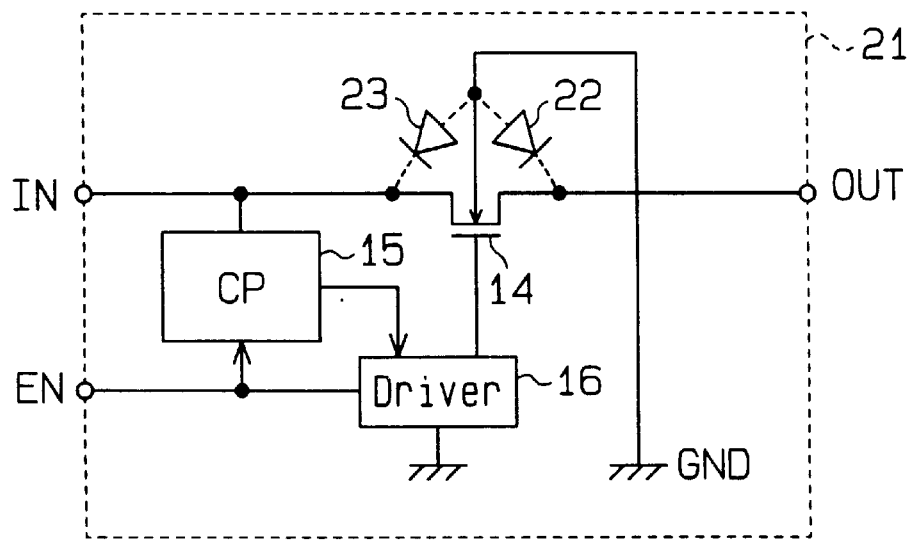
FIG. 2 is a schematic block diagram showing a second example of a prior art switch circuit.
Figure 3:
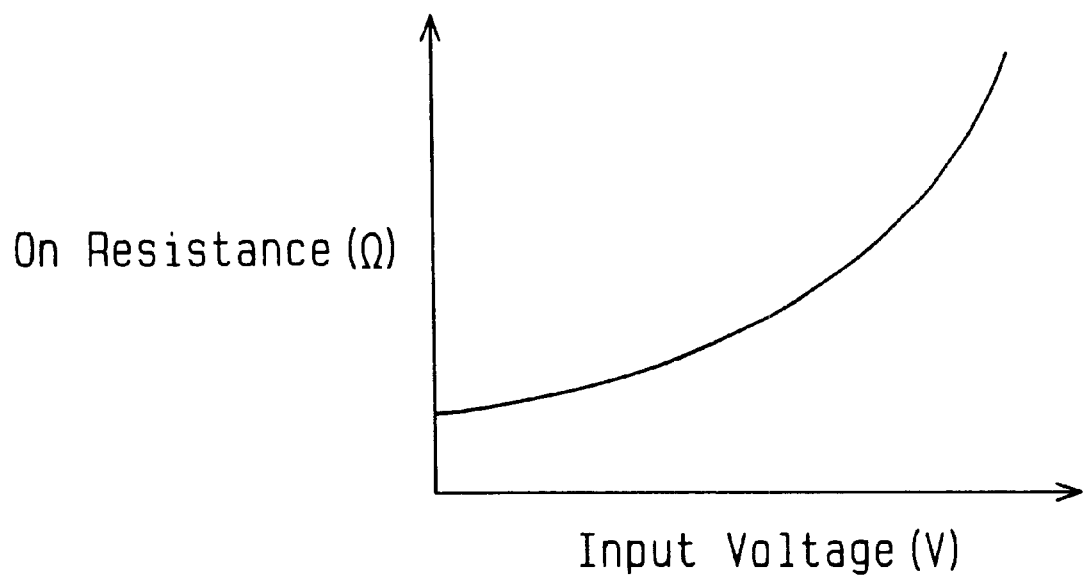
FIG. 3 is a graph showing the relationship between the input voltage and the on resistance of the switch circuit of FIG. 2.
Figure 4:
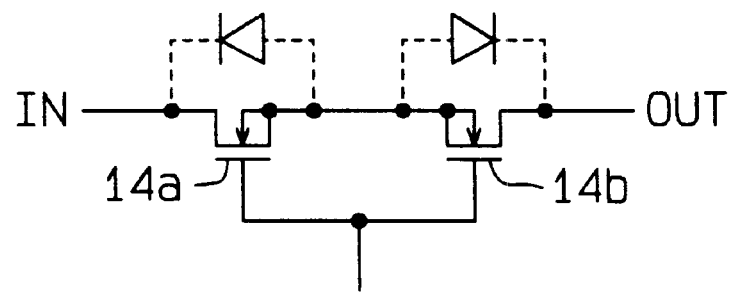
FIG. 4 is a schematic circuit diagram showing a third example of a prior art switch circuit.

When the control signal EN provided to the driver circuit 45 goes low, the driver circuit 45 provides the gate drive signal SG having the ground GND level to the gate of the transistor 14, which deactivates the transistor 14. Further, the back gate drive circuit 33 provides the back gate of the transistor 14 with the back gate drive signal SB having the ground GND level. This inhibits the supply of drive power to the driven circuit 13 (FIG. 2) and reduces the power consumed by the portable electronic device 300.

The second embodiment has the advantages described below.
(1) The on resistance of the transistor 14 in the series regulator 41 is not affected by the input voltage. Further, the parasitic diode 22 inhibits the flow of back current when the transistor 14 is deactivated.

It should be apparent to those skilled in the art that the present invention may be embodied in many other specific forms without departing from the spirit or scope of the invention. Particularly, it should be understood that the present invention may be embodied in the following forms.

Instead of connecting the level shift circuit 32 to the input of the back gate drive circuit 33, the level shift circuit 32 may be connected to the input of the driver circuit 16 in accordance with the voltage level of the control signal EN.

The level shift circuit 32 may be connected to the inputs of the driver circuit 16 and the back gate drive circuit 33.

The present examples and embodiments are to be considered as illustrative and not restrictive, and the invention is not to be limited to the details given herein, but may be modified within the scope and equivalence of the appended claims.

What is claimed is:

1. A switch circuit including an input terminal and an output terminal, the switch circuit comprising:
   a MOS transistor connected between the input and output terminals;
   a gate drive circuit connected to a gate of the transistor to provide a gate drive signal thereto, wherein the gate drive circuit responds to a first control signal provided to the switch circuit and causes the gate drive signal to have one of a first drive voltage, which is derived from a voltage at the input terminal, and a low potential power supply level; and
   a back gate drive circuit connected to a back gate of the transistor for providing a back gate drive signal thereto having substantially the same phase as the gate drive signal, wherein the back gate drive circuit controls a voltage of the back gate drive signal in accordance with whether the transistor is activated or deactivated.

2. The switch circuit according to claim 1, wherein the back gate drive circuit responds to the first control signal and causes the back gate drive signal to have substantially the same voltage as the gate drive signal when the transistor is deactivated, and substantially the same voltage as the output terminal when the transistor is activated.

3. The switch circuit according to claim 1, wherein the gate drive circuit includes a charge pump circuit connected to the input terminal, wherein the charge pump circuit is activated by the first control signal and pulls up the voltage at the input terminal to generate the first drive voltage.

4. The switch circuit according to claim 1, further comprising a level shift circuit for shifting a voltage level of the first control signal to generate a second control signal, wherein the level shift circuit provides the second control signal to at least one of the gate drive circuit and the back gate drive circuit, and wherein whichever of the gate drive circuit and the back gate drive circuit receiving the second control signal controls the voltages of the gate drive signal and the back gate drive signal in response to the second control signal, respectively.

5. A series regulator including an input terminal and an output terminal, the series regulator comprising:
   a switch circuit including,
      a MOS transistor connected between the input and output terminals;
      a gate drive circuit connected to a gate of the transistor to provide a gate drive signal thereto, wherein the gate drive circuit responds to a first control signal and to a detection signal provided to the switch circuit and causes the gate drive signal to have one of a first drive voltage, which is derived from a voltage at the input terminal, and a low potential power supply level; and
      a back gate drive circuit connected to a back gate of the transistor for providing a back gate drive signal thereto having substantially the same phase as the gate drive signal, wherein the back gate drive circuit controls a voltage of the back gate drive signal in accordance with whether the transistor is activated or deactivated; and
   a comparison amplifier for comparing the voltage at the output terminal with a predetermined reference voltage to generate the detection signal based on the comparison result.

6. The series regulator according to claim 5, wherein the back gate drive circuit responds to the first control signal and causes the back gate drive signal to have substantially the same voltage as the gate drive signal when the transistor is deactivated, and substantially the same voltage as the output terminal when the transistor is activated.

7. The series regulator according to claim 5, wherein the gate drive circuit includes a charge pump circuit connected to the input terminal, wherein the charge pump circuit is activated by the first control signal and pulls up the voltage at the input terminal to generate the first drive voltage.

8. The series regulator according to claim 5, further comprising a level shift circuit for shifting a voltage level of the first control signal to generate a second control signal, wherein the level shift circuit provides the second control signal to at least one of the gate drive circuit and the back gate drive circuit, and wherein whichever of the gate drive circuit and the back gate drive circuit receiving the second control signal controls the voltages of the gate drive signal and the back gate drive signal in response to the second control signal, respectively.

9. A switch circuit having an input terminal and an output terminal, comprising:
   a main switch connected between the input terminal and the output terminal;
   a charge pump connected to the input terminal and the main switch and receiving a first control signal, the first control signal activating and deactivating the charge pump;
   a driver circuit connected to the charge pump and the main switch and receiving the first control signal, wherein when the first control signal is activated, the charge pump pulls up an input voltage supplied to the input terminal to a predetermined level and provides a drive voltage to the driver circuit, which in turn generates a drive signal having substantially the same voltage as the drive voltage, wherein the driver circuit supplies the drive signal to the main switch, thereby activating the main switch such that the input voltage is supplied at the output terminal, and wherein when the first control signal is deactivated, the drive signal is deactivated, which deactivates the main switch such that the input voltage is not provided at the output terminal;
   a level shift circuit that receives the first control signal and generates a second control signal having substantially the same voltage level as the input voltage; and a back gate drive circuit connected between the level shift circuit and the main switch and, in response to receiving the second control signal, the back gate drive circuit generates a back gate drive signal having substantially the same voltage as the voltage at the output terminal to the main switch, wherein the back gate drive circuit comprises:
      first and second transistors connected in series between the output terminal and a ground, and the gates of the first and second transistors are connected together, wherein the second control signal is provided to a node between the gates of the first and second transistors and the back gate drive signal is generated at a node between the drains of the first and second transistors.

10. The switch circuit of claim 9, wherein the main switch comprises an NMOS transistor, wherein the drain of the transistor is connected to the input terminal, the source of the transistor is connected to the output terminal, the gate of the transistor is connected to the driver circuit, and a back gate of the transistor is connected to the back gate drive circuit.

11. The switch circuit of claim 10, further comprising:
   a driven circuit connected to the output terminal of the switch circuit, wherein the switch circuit supplies power to the driven circuit when the transistor is turned on.

* * * * *